(12) United States Patent
Franca et al.

(10) Patent No.: US 6,178,973 B1
(45) Date of Patent: Jan. 30, 2001

(54) METHOD AND APPARATUS FOR OZONE GENERATION AND SURFACE TREATMENT

(75) Inventors: Daniel L. Franca, Poughkeepsie; George F. Ouimet, Jr., Millbrook; Uldis A. Ziemins, Poughkeepsie, all of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/123,536

(22) Filed: Jul. 28, 1998

(51) Int. Cl.⁷ ............................. B08B 7/00; B08B 7/04; B08B 3/00
(52) U.S. Cl. ................. 134/1.3; 134/18; 134/36; 134/102.1; 134/102
(58) Field of Search ............... 134/102.1, 102.2, 134/902; 137/1, 1.3, 2, 3, 36, 34, 18

(56) References Cited

U.S. PATENT DOCUMENTS

| | | |
|---|---|---|
| 4,252,623 | 2/1981 | Vaseen . |
| 4,292,093 | 9/1981 | Ownby et al. . |
| 5,024,968 | 6/1991 | Engelsberg . |
| 5,304,352 | 4/1994 | Bellettini et al. . |
| 5,503,708 * | 4/1996 | Koizumi et al. ............... 134/1.3 X |
| 5,580,421 * | 12/1996 | Hiatt et al. .................... 134/1.3 X |
| 5,643,367 | 7/1997 | Viel . |
| 5,669,979 | 9/1997 | Elliott et al. . |
| 5,709,754 * | 1/1998 | Morinville et al. ............... 134/1.3 |
| 5,729,343 * | 3/1998 | Aiyer ........................... 356/355 |

OTHER PUBLICATIONS

Handbook of Semiconductor Wafer Cleaning Technology, Noyes Publications. pp. 201–273, 1993.*

* cited by examiner

*Primary Examiner*—Alexander Markoff
(74) *Attorney, Agent, or Firm*—Ratner & Prestia

(57) ABSTRACT

A method and apparatus for treating the surface of a substrate includes generating ozone in a generation chamber by using an optical source and transporting the ozone to a treatment chamber containing the substrate. The surface treatment utilizes an optical energy source and the generated ozone. The generation chamber and the treatment chamber are initially isolated from one another, which allows for the selective regulation of delivering ozone from the generation chamber to the treatment chamber. Preferably, a single optical source both generates ozone in the generation chamber and serves to clean and/or planarize the surface in the treatment chamber.

40 Claims, 6 Drawing Sheets

METHOD AND APPARATUS FOR OZONE GENERATION AND SURFACE TREATMENT

BACKGROUND OF THE INVENTION

The present invention generally relates to the treatment of a substrate surface. Surface treatment, for example oxidizing, cleaning, or planarizing a substrate surface, is a critical operation, especially in the semiconductor industry, where irregularities within a surface or foreign contaminants on the surface can cause device failure. The sensitivity to foreign matter on the surface and to irregularities within the surface is increased as device sizes shrink in the semiconductor industry. Foreign matter as small as sub-micron particles can destroy a semiconductor integrated circuit. Furthermore, when a surface treatment is being carried out, it is desirable that the treatment does not otherwise damage the substrate surface being treated.

An example of foreign matter which commonly must be removed from a surface in the semiconductor industry is organic material. Photoresist is an example of an organic material frequently used in the semiconductor processing industry. After a photoresist film has been used to create a mask on a semiconductor surface being processed, it is generally necessary that the photoresist film be completely removed before subsequent fabrication processes may be carried out. The complete removal of the photoresist film is made more difficult when the photoresist film becomes hardened on the substrate surface. Hardening of the photoresist film occurs when the photoresist film is exposed to a plasma environment or ion implantation, two common fabrication processes. Incompletely removed photoresist can cause device failures.

It is commonly known that organic contaminants may be removed by ultraviolet (uv) cleaning. Ultraviolet light, which is defined by the wavelength range of 4 nm to 380 nm, has been known to decompose organic molecules. Another method known in the art which is useful for removing or assisting in the removal of unwanted organic material is the chemical oxidation of these organics.

Processes and apparatus for using uv light to decompose organic molecules and treat a substrate surface are known in the related art. The related art also provides a method for the generation of ozone for use in surface treatment. The production of ozone from high voltage discharges between metal electrodes, however, frequently produces metal ion contaminants unsuitable for the semiconductor processing industry. A further shortcoming of the prior art is that separate sources of energy are required for ozone production and uv light surface treatment.

SUMMARY OF THE INVENTION

The present invention embodies both the method and apparatus for the treatment of a substrate surface, by generating ozone, utilizing the ozone for surface treatment and using a light energy source for additionally treating the substrate surface. The invention includes at least one optical source having an optical path. The light energy source used for surface treatment in the treatment chamber may be the same light energy source used to generate ozone in a separate generation chamber.

The present invention includes at least two distinct chambers: An ozone generation chamber containing oxygen and disposed along the optical path of the optical source; and a surface treatment chamber. Ozone generation and surface treatment may occur simultaneously. The chambers may be separated by a quartz plate to provide for a single optical source to be used for the simultaneous surface treatment in the treatment chamber and ozone generation in the generation chamber. The surface treatment of the present invention may involve oxidation, cleaning, planarization, or a combination of the three.

The generation chamber includes optical condensing means which function as a collimator to focus the optical energy source into a focal point where ozone is generated. Ozone produced in this manner is free of the undesirable metal ion contaiminants associated with ozone generation between metal electrodes using high voltage.

The generated ozone is withdrawn from the generation chamber and transported to the treatment chamber to chemically assist in the surface treatment. The ozone gas may be mixed with another constituent prior to its introduction into the treatment chamber, or the ozone and constituent may be intermixed with each other once both have been transported to the treatment chamber. The other component may be a gas, a liquid, or a liquid which has been heated by the ozone to form a vapor.

Within the treatment chamber, the gases or components may be delivered to the surface of the substrate or they may be delivered into the chamber at a location remote from the surface to be treated. The treatment chamber contains a substrate with matter on the surface, as well as a substrate holder. This holder may also include a chilling plate or a heating element.

The present invention is directed to both the process for generating ozone and for performing the surface treatment detailed above, and also the multi-chamber apparatus for carrying out this treatment.

BRIEF DESCRIPTION OF THE DRAWING

The invention is best understood from the following detailed description when read in connection with the accompanying drawing. It is emphasized that, according to common practice, the various features of the drawing are not the scale. On the contrary, the dimensions of the various features are arbitrarily expanded or reduced for clarity. Included in the drawing are the following figures.

DETAILED DESCRIPTION OF THE INVENTION

Figure 1:
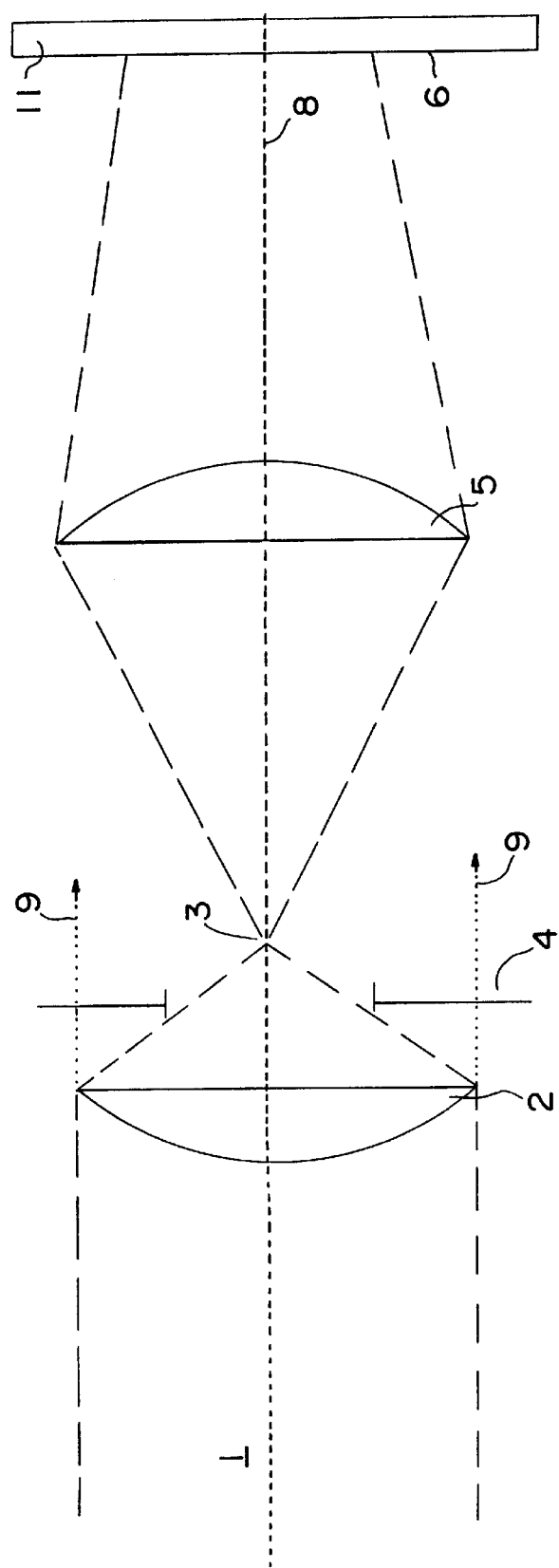
FIG. 1 is a schematic side view of selected components of a light source and a light beam being focused.

The present invention provides both a method and an apparatus for treating the surface of a substrate. Substrates which may be treated by use of the present invention may include a semiconductor substrate, for example a silicon wafer, a photo mask, a flat panel display, a glass component, or any substrate with a surface requiring cleaning, planarizing, or oxidizing in a controlled fashion.

The surface treatment presented by the invention may include chemically oxidizing the surface and/or foreign matter contained on the surface by use of ozone; it may include oxidation of foreign matter contained on the surface coupled with cleaning the surface; it may include the oxidation of the surface followed by the planarization of that surface, and it may also include the oxidation the surface followed by both a cleaning and planarizing treatment. The cleaning process may include laser steam cleaning, liquid spray cleaning, or chemical bath cleaning, or any other suitable cleaning method.

The invention presents an apparatus for carrying out this treatment process. The apparatus includes at least two distinct chambers. The two chambers include an ozone generation chamber and a substrate surface treatment chamber. An additional treatment and/or generation chamber may be used, depending on the process requirements. In the generation chamber, ozone ($O_3$) is produced from an oxygen source using an optical energy source such as an ultraviolet (uv) light beam. Optical condensing means disposed along the optical path are used to focus the light beam to a focal point at (or near) which location ozone is generated from the oxygen contained in the generation chamber. The generation of ozone in this manner is a clean process, compared with the generation of ozone by use of high voltage across metallic electrodes. The generation of ozone by use of high voltage metallic electrodes often produces metal ion contaminants within the ozone generated. Such metal ion contamination is undesirable on a substrate, especially on a semiconductor substrate where metal ion contamination can cause device failure.

The apparatus for the present invention also provides a method for withdrawing the generated ozone in a first stream from the generation chamber and transporting it into the treatment chamber. The generated ozone may be mixed with another stream before or after it is delivered to the treatment chamber. In the treatment chamber, the substrate surface is processed first by being exposed to ozone, which can oxidize the substrate surface and foreign material contained on the surface. This ozone treatment may completely remove some foreign material, and, by oxidation, will render other foreign matter more easily removable in subsequent processing.

After the oxidation, or "pre-treatment," is complete, the substrate surface is further treated. The subsequent treatment procedure may comprise both a physical component using the light source and a chemical component using a liquid and/or gas source which has been delivered to the treatment chamber and includes the generated ozone. In a preferred embodiment the optical source used to produce the ozone in the generation chamber is the same optical source which extends into the treatment chamber and is used as the laser or ultraviolet light component of the surface treatment.

The various embodiments of the present invention may be understood by reference to the following drawings.

FIG. 1 shows a beam 1 which provides optical energy. The optical source from which beam 1 emanates may be a laser or uv light source capable of producing ozone at a focal point along the optical path 9. In a preferred embodiment an Excimer laser at 193 nm may be used as the optical source. As shown in FIG. 1, beam 1 is focused to a focal point 3 along the optical axis 8. Ozone is generated at (and around) the focal point 3. Various known optical condensing means may be used to focus the beam to a focal point 3.

Examples of optical condensing means include a relay system, a Keplerian telescope, and a multi-facet homogenizer. A Keplerian telescope is depicted in FIG. 1. Beam 1 from the laser/uv source is directed into a spherical or cylindrical lens 2 whereby a focal point 3 is generated at the focal length of the lens 2. At and around the focal point 3, ozone is generated and captured within an enclosure surrounding the optical system—the generation chamber. An aperture stop 4 may be used to constrain the optical light bundle directed to the optical element 5 which may also be a cylindrical or spherical lens. The second lens 5 allows for the beam to provide energy to the work surface 6 of the substrate 11. In a preferred embodiment the ratio of the focal lengths of the first lens 2 and the second lens 5 is approximately 4:1 to develop a thin rectangular beam of light at the work surface 6 of approximately four inches by 0.125 inches.

Numerous optical configurations may be used to achieve the desired goal of both generating ozone and providing a light beam component at the work surface 6. The embodiment depicted in FIG. 1 is just one example. In a preferred embodiment, the configuration of the optical systems may be chosen to achieve the most uniform beam and energy density at the work surface, while simultaneously producing a sufficient supply of ozone in the generation chamber.

Figure 1A:
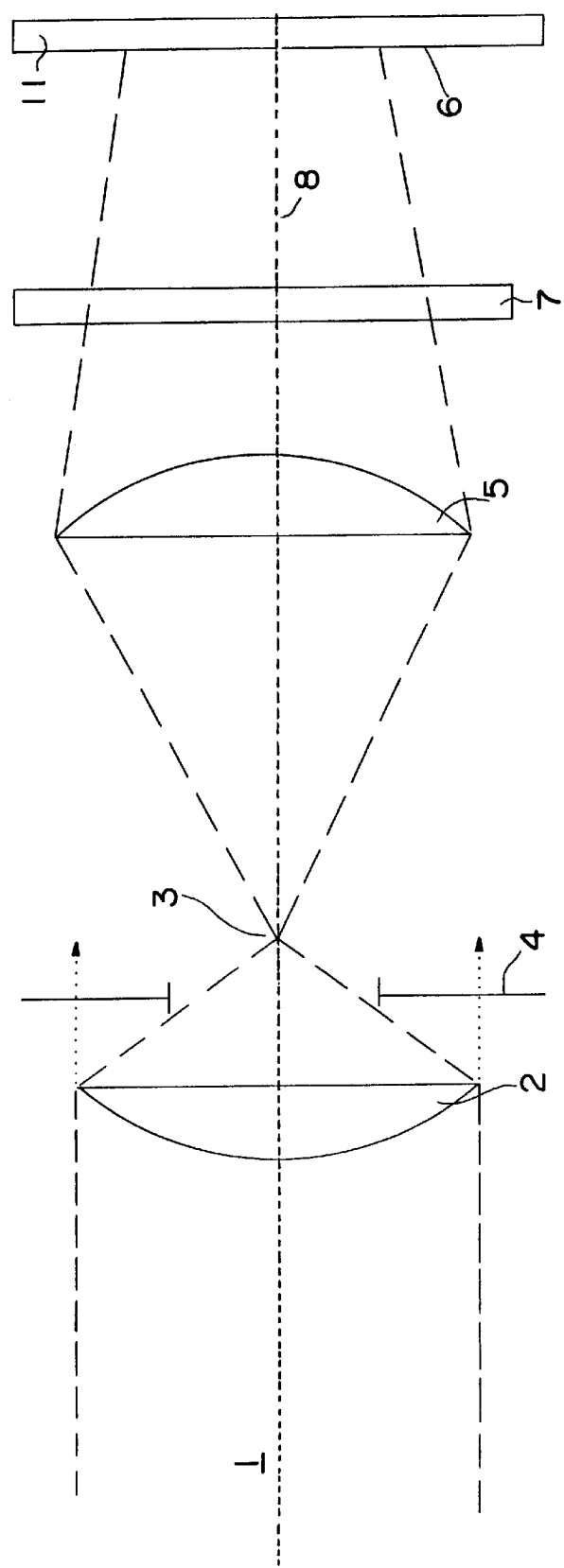
FIG. 1A is a schematic side view of selected components of a light source and a light beam being focused, including a quartz window.

FIG. 1A shows an alternative embodiment of the optical system depicted in FIG. 1. FIG. 1A includes a quartz window 7 between the optical condensing means and the work surface 6. The quartz window allows for transmission of the light energy beam. An anti-reflective coating common to the optics industry may be added to the quartz plate to minimize the attenuation during transmission of the beam. This configuration may be used in the embodiment wherein the same optical source is used to perform both the ozone generation in the generation chamber and the substrate surface treatment in the treatment chamber. If the quartz plate is not perpendicular to the incident light beam, an optical compensator, such as a slightly angled lens or another quartz plate, may be used to correct for any abberation of the transmission light beam.

Figure 2:
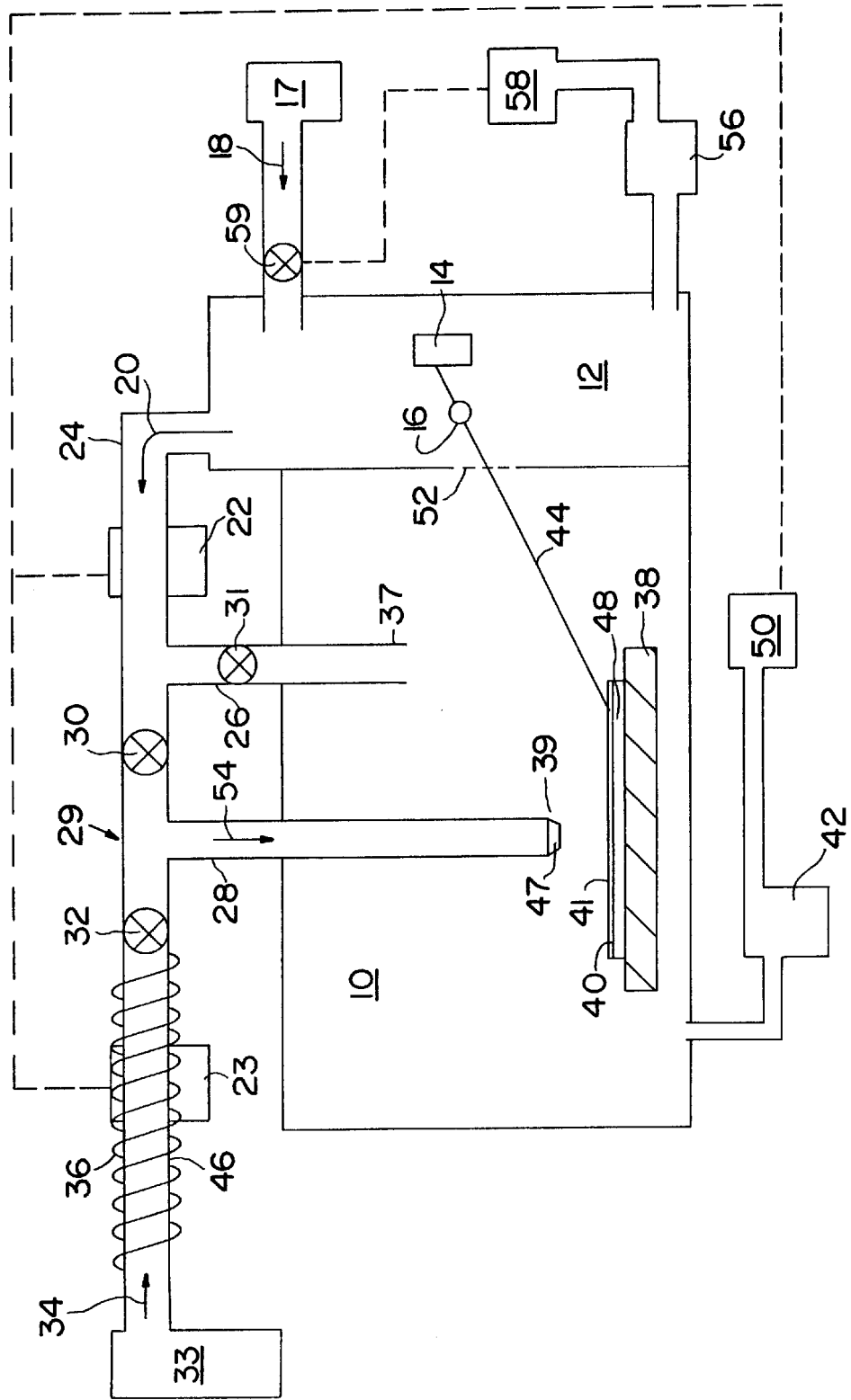
FIG. 2 is a schematic view of a two chamber embodiment of the invention for treating a substrate.

FIG. 2 shows a side view of the present invention according to a preferred embodiment having two chambers. The treatment chamber 10 is the chamber in which the substrate is treated. The generation chamber 12 is the chamber where ozone is generated.

In the generation chamber 12, a light source 14 produces a beam 44 which provides optical energy. The source 14 may be adjusted to produce light energy sources of various intensities and configurations. The optical source may be a laser or other uv source. As depicted in FIGS. 1 and 1A, optical condensing means are disposed along the optical path 9 to focus the beam 44 to focal point 16 at which ozone will be generated. In an alternative embodiment (not shown), the light source may be positioned outside of the generation chamber and a quartz window or other light permeable member may provide for transmission of the beam into the generation chamber.

The ozone generated at the focal point 16 within the generation chamber 12 is produced from an atmosphere including oxygen. The atmosphere may be ambient air, or it may include an oxygen containing gas stream 18 delivered to the chamber from a gas source 17 which includes oxygen. The oxygen source stream 18 may include oxygen with a number of other carrier or diluent gases such as nitrogen or a noble gas. The ozone produced in the generation chamber is withdrawn from the generation chamber in a first stream 20 exiting the generation chamber. The means for withdrawing the generated ozone out of the generation chamber may include gas tubing or conduit 24.

The ozone generation process may be regulated by regulating means. Generation chamber atmospheric measuring device 56 senses the atmospheric conditions within the chamber. These conditions include the concentration of ozone and oxygen within the generation chamber 12. Measuring device 56 provides this information to atmospheric control means 58 which controls the gas flow 18 into generation chamber 12 by controlling valve 59 which regulates the amount of gas transported into the generation chamber, depending on processing needs.

First stream 20 which contains the generated ozone may also include other diluent or carrier gases from the generation chamber such as $N_2$ or a noble gas depending on processing conditions and the oxygen source, or may be purely ozone. The first stream 20 may be delivered to the process chamber 10 in various manners, with or without prior mixing with another gas or vapor or liquid. In one embodiment, with valves 32 and 30 closed, the first stream containing ozone 20, is delivered to the treatment chamber 10 through tube or conduit 26 and opened valve 31, whereby the stream is introduced into the chamber at a point not proximate to the substrate surface to be treated. In an alternative embodiment, valves 31 and 32 are closed while valve 30 is open so that first stream 20 is delivered to treatment chamber 10 at a point proximate to the substrate surface. In another alternative embodiment valve 31 may be closed and valves 30 and 32 may be opened. In this embodiment, the first stream 20 may be mixed with a second stream 34 at the junction 29 of gas tubing members 24 and 46. The second stream 34 may be a liquid, a gas, or it may be a liquid which is vaporized by the use of heating coils 36 to produce a vapor at the point 29 where the two streams mix.

The second gas source 33 of the second stream 34 may include other inert or reactive constituents. These constituents may include noble gasses, $N_2$, water, HCl, HF, $NH_3$, helium, IPA, or DI water. The particular constituent or constituents selected depends on the processing needs and other parameters. In the preferred embodiment, the ozone-containing stream 20 is mixed with deionized water vapor provided by the heating of second stream 34. The two streams combine at junction 29 to form a gaseous mixture 54 which is transported via tubing member 28 to the substrate surface. The point of delivery 39 may be configured so that it is proximate to the substrate surface being treated, as depicted in FIG. 2. In the preferred embodiment, the mixture 54 of DI water vapor and the ozone-containing stream are delivered proximately to the substrate surface. In an alternate embodiment the point of delivery 39 may be chosen so that it is not proximate to the surface being treated.

In another embodiment the mixing between stream 20 and second stream 34 may take place after both have been introduced into the treatment chamber 10. With valve 30 closed and valves 32 and 31 open, the first stream 20 enters the treatment chamber 10 through tube 26 at point of delivery 37. The second stream 34 is delivered into the chamber through tube 28 at point of delivery 39. The point of delivery 39 may again be chosen to be near the substrate surface being treated or may be remote from the surface. In this embodiment, the mixing of the two streams takes place within the treatment chamber 10.

Substrate holder 38 holds the substrate 48 within the treatment chamber 10. The substrate holder 38 may include a chilling element or a heating element depending on the processing treatment so desired. If a chiller is used, a condensate 41 may form on the surface of the substrate from the vapors delivered from tube member 28 to the surface through port 47 which may be a diffuser, nozzle or other orifice at the point of delivery 39. In the preferred embodiment, the mixture of DI water vapor and ozone forms a condensate 41 at the surface. The substrate holder 38 may also include movement means for moving the substrate holder during processing (surface treatment) in a known manner.

The substrate surface 40 may contain foreign, contaminating material. In the semiconductor processing industry, the surface of a substrate to be treated may be a silicon wafer with an integrated circuit being fabricated onto it.

Within the semiconductor industry, organic contaminating matter is commonly found on the surface of the substrate, especially due to residual photoresist which may be hardened due to aggressive processing conditions. This is particularly true when the photoresist residual on the substrate surface has been hardened by an ion implantation or plasma etching process. While organic contaminants are common, other contaminants may be present such as metals, silicon, oxides, and minerals.

Each type of contaminant may require different treatment conditions for most efficient removal. The ozone containing stream 20 or mixture 54 first treats the surface 40 of the substrate 48 by oxidizing matter on the substrate surface 40. The "pre-treatment," or oxidation, of foreign matter on the surface makes some matter easier to be subsequently removed. Such is the case for organic contaminants, such as residual photoresist. Alternatively, this oxidation of foreign matter may completely remove the material from the surface 40.

With the foreign matter contained on the substrate now oxidized (the "pre-treatment" complete), the subsequent treatment processing may now take place. The subsequent processing may include the cleaning and/or planarizing of the surface 40. Cleaning may include laser steam cleaning, cleaning by use of liquid spray, or cleaning within a chemical bath. Each type of cleaning requires different conditions for efficient treatment. Cleaning is accomplished using both chemical cleaning processes and physical processes. Light energy can be used to physically decompose foreign matter such as organics. The light energy source 44 used at the substrate surface 40 in the treatment chamber 10 may be the same light beam 44 as used in the generation chamber 12 to generate ozone.

In a preferred embodiment, a solid light permeable member 52 (e.g., a quartz plate) disposed between the two chambers, allows for transmission of a laser beam 44 between chambers. In an alternative embodiment, an optical compensator may replace the quartz plate to correct for any abberations induced and to allow transmission, while retaining ozone generation. In a preferred method for treating the substrate, the substrate holder 48 is moved relative to the laser by use of movement means in a known way, so that the laser sweeps across the substrate surface for steam cleaning. In another preferred method for cleaning, the light source (feature 14 of FIG. 2) may include means such as a rotating mirror or a galvanometer, for moving the beam 44 with respect to a stationary substrate.

Processing conditions may be chosen to maximize cleaning efficiency for the particular substrate and foreign material being removed. In an alternate embodiment, the processing conditions may be chosen so that the transported ozone, which may be in combination with other carrier or diluent inert gases, reacts more aggressively with the surface to planarize the substrate surface being treated. In yet another embodiment, all three processes may take place:

oxidation followed by the cleaning and/or planarizing treatment of the surface.

Conditions within the treatment chamber 10 may be monitored and controlled to produce the desired surface treatment. A measuring device 42 may be used to measure a plurality of treatment chamber conditions, including the vapor concentration. The measuring device 42 provides information to control means 50 which may control the flow of first stream 20 and the flow of the second stream 34 by means of regulating and modulating means which control gas delivery into the treatment chamber. Ozone gas stream regulating and modulating means 22 regulates and modulates the flow of stream 20; second stream regulating and modulating means 23 regulates and modulates the flow of second stream 34, and both modulating means are responsive to control means 50. By monitoring and regulating the gas delivery to the treatment chamber, the gas mixture concentration requirements may be maintained, and the process conditions at the site on the surface being treated may be controlled to produce the desired treatment.

Figure 3:
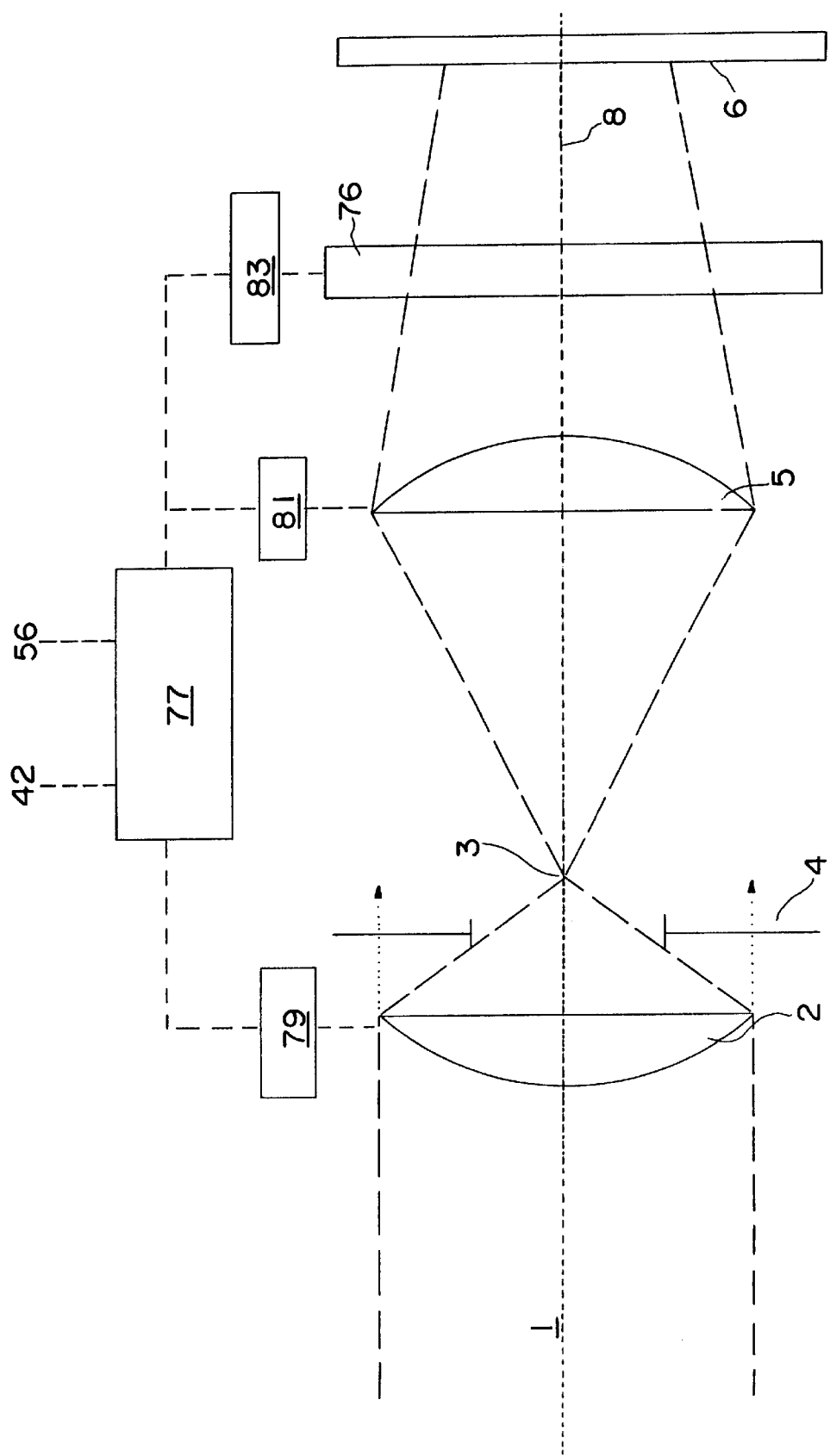
FIG. 3 is a schematic side view of selected components of a light source and a beam being focused, including optical control means.

FIG. 3 shows the optical control means which controls light energy in the treatment process as well as the focal point produced by the optical condensing means used in the generation process. Optical control means 77 is responsive to inputs from both the measuring device 42 (as also depicted in FIG. 2) and generation chamber atmospheric measuring device 56 (also as depicted in FIG. 2). Regulating means 79, 81, and 83 are responsive to the optical control means 77. Based on the process conditions, and the conditions for the desired treatment processes, the optical control means 77 may be used to control the optics to maximize ozone generation at the focal point 3, or, alternatively, the energy distribution and beam density achieved in the treatment chamber at surface 6. The optical control means 77 may be responsive to real time changes within the treatment chamber and within the generation chamber so that regulating means 79, 81, and 83 may regulate the optical source so that the process of ozone generation and the process of surface treatment may be alternately maximized during the simultaneous production of ozone and treatment of a substrate surface.

In addition to the optical control means described in conjunction with FIG. 3, the settings within the light source (feature 14 of FIG. 2) may also be varied to produce the light beam characteristics to achieve the desired ozone production or surface treatment needs. Such settings, or set of parameters, of a light source, and the manipulation of such settings to achieve the desired light beam characteristics, are well-known in the art.

Figure 4:
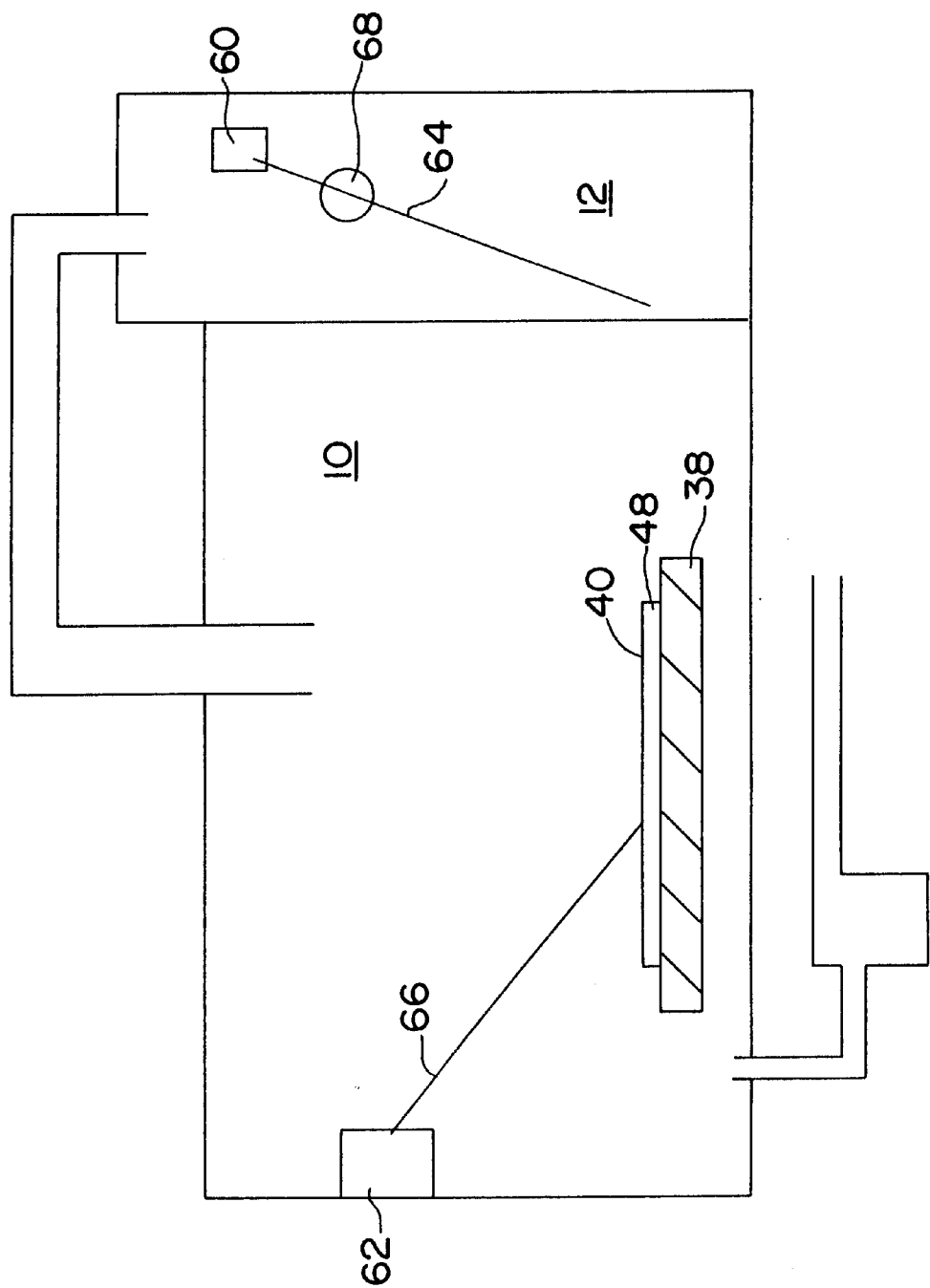
FIG. 4 is a schematic view of an alternative embodiment of the two chamber apparatus with two optical sources.

FIG. 4 shows an alternative embodiment of the two chamber apparatus containing a treatment chamber 10 and a generation chamber 12. In this alternate embodiment two distinct optical energy sources are produced by two light sources 60 and 62. Within the generation chamber 12, light source 60 provides a beam 64 which by way of optical condensing means is focused to focal point 68 where the ozone is generated. This source 60 may provide a laser or other uv light source capable of producing ozone. A second light source 62 positioned within the treatment chamber 10 provides a separate beam 66 as an optical energy source which is used in surface treatment. The beam 66 typically used for surface treatment will be a laser. In an alternative embodiment (not pictured) either optical source 60 or 62 may be situated outside of the generation chamber and the treatment chamber.

The substrate 48 may be introduced into the treatment chamber by a substrate loading means (also not depicted). The substrate loading means may provide for automated loading, and may further comprise substrate unloading means. Thus, the introduction of the substrate to the treatment chamber may be done manually, automatically, or continuously. The substrate loading means may further include movement means 70, which provide for motion of the substrate relative to the optical energy source, during the treatment process. This will allow for the optical beam to sweep across the substrate surface during processing.

Figure 5:
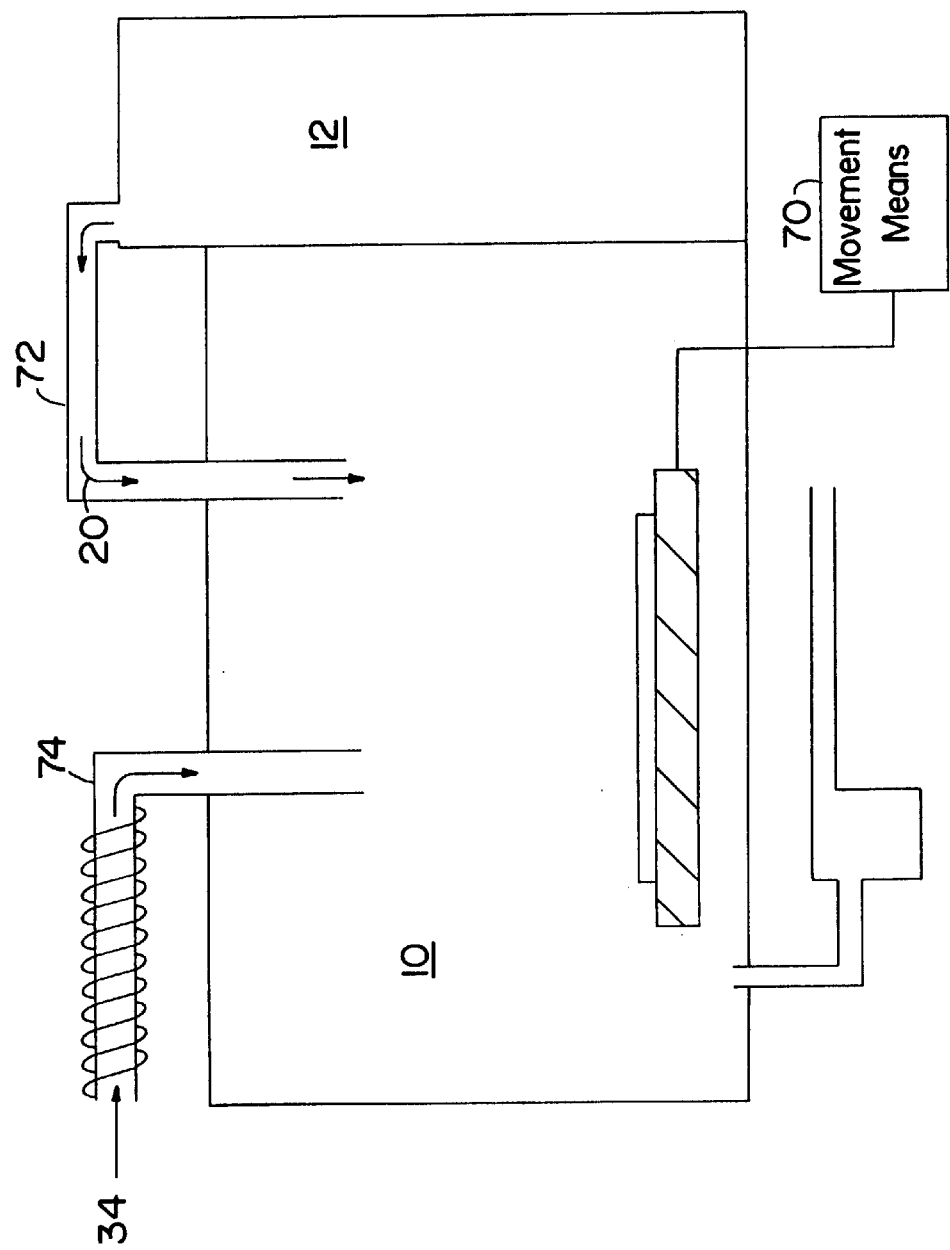
FIG. 5 is a schematic view of an alternate embodiment of the two chamber apparatus used to treat substrates.

FIG. 5 shows an alternative embodiment of the two chamber apparatus including a generation chamber 12 and a treatment chamber 10. In the embodiment depicted in FIG. 5, the first stream containing ozone 20 is delivered into the process chamber by means of gas tubing or conduit 72. The second stream 34 is delivered into the treatment chamber by use of gas tubing or conduit 74. In this alternative embodiment gas tubings 72 and 74 are distinct and are not connected. In this embodiment no mixing may occur prior to the introduction of the two streams to the treatment chamber where the streams are intermixed.

The previous embodiments were shown to illustrate some of the various embodiments of the present invention and are not intended to limit the scope nor the spirit of the present invention. The method of ozone generation at the focal point of the optical energy source may be carried out in a number of manners. The oxygen source from which the ozone is produced may be delivered to the generation chamber in a number of manners with a number of additional components or it may comprise ambient air. The means for withdrawing and delivering the generated ozone from the generation chamber to the treatment chamber may take many forms. A second stream may be added to the ozone containing stream, or it may not be utilized. The mixing location and method may be varied. The treatment carried out within the treatment chamber may include oxidation, cleaning, planarization, or any combination of the three. The invention may include one light source for carrying out both processes, or it may include more than one.

Although illustrated and described herein with reference to certain specific examples, the present invention is nevertheless not intended to be limited to the detail shown. Rather, various modifications may be made to the details within the scope and range of equivalence of the claims and without departing from the spirit of the invention. Such modifications include, for example, various embodiments of the apparatus configuration, the treatment process, the gas or liquid transporting means, the mixing points, the applications for different substrates, the means for regulating and controlling the conditions in the generation chamber, the conditions in the treatment chamber, and the optical energy source used. The scope of the present invention is expressed by the appended claims.

What is claimed:

1. A method for treating a substrate, said method comprising the steps of:
   a) providing at least one optical source having an optical path;
   b) providing a generation chamber containing oxygen and disposed along said optical path;
   c) generating ozone in said generation chamber by focusing said at least one optical source within said generation chamber;
   d) providing a treatment chamber, which is isolated from said generation chamber and which contains said substrate having a surface with matter thereon;
   e) withdrawing said ozone in a first stream from said generation chamber;

f) delivering said first stream containing sad ozone to said treatment chamber containing said substrate to oxidize said matter on said surface; and g) directing said at least one optical source onto said surface to physically perform at least one of a cleaning or planarizing operation upon said surface of said substrate.

2. The method of claim 1, wherein said first stream further comprises at least one constituent.

3. The method of claim 1, in which step g) includes removing said oxidized matter from said surface.

4. The method of claim 1, wherein the step g) comprises cleaning said surface.

5. The method of claim 1, wherein the step g) comprises planarizing said surface.

6. The method of claim 1, wherein the step of focusing said at least one optical source comprises utilizing condensing optical means.

7. The method of claim 1, wherein the step of generating ozone in said generation chamber by focusing said at least one optical source results in formation of a focal point along said optical path within said generation chamber.

8. The method of claim 1, further comprising introducing a second stream containing at least one constituent to said treatment chamber, separate from said first stream.

9. The method of claim 8, further comprising heating said second stream.

10. The method of claim 1 further comprising, prior to the step of delivering said first stream containing said ozone to said treatment chamber, mixing a second stream containing at least one constituent with said first stream.

11. The method of claim 10, further comprising heating said second stream prior to mixing said second stream with said first stream.

12. The method of claim 2, wherein said generation chamber further contains said at least one constituent and the step of withdrawing said ozone comprises withdrawing said ozone and said at least one constituent from said generation chamber.

13. The method of claim 2, wherein said constituent is selected from the group consisting of $N_2$, $H_2O$, HCl, HF, $NH_3$, He and isopropyl alcohol.

14. The method of claim 1, wherein said optical source has a set of parameters describing said optical source, and said method further comprises selecting said parameters to maximize said ozone generation.

15. The method of claim 1, wherein said optical source has a set of parameters describing said optical source, and said method further comprises selecting said parameters to maximize the step of utilizing said at least one optical source to at least one of clean or planarize said substrate.

16. The method of claim 1, further comprising alternating between maximizing said ozone generation over a first time period, and maximizing said step of utilizing said at least one optical source to at least one of clean or planarize said substrate over a second time period.

17. The method of claim 1 further comprising:

sensing a plurality of conditions in said treatment chamber; and regulating, in response to said plurality of conditions, the delivery of said ozone and said at least one constituent to said treatment chamber.

18. The method of claim 1 further comprising cooling said substrate within said treatment chamber.

19. The method of claim 1 further comprising heating said substrate within said treatment chamber.

20. The method of claim 1, further comprising controlling the pressure of said oxygen in said generation chamber to optimize the amount of ozone generated.

21. The method of claim 2, wherein the step of delivering said first stream containing said ozone and at least one constituent comprises delivering said first stream and said at least one constituent directly to a position adjacent said surface of said substrate.

22. A method for treating a substrate, said method comprising the steps of:

a) providing an optical source having an optical path;

b) providing a generation chamber containing oxygen and disposed along said optical path;

c) generating ozone in said generation chamber by focusing said optical source within said generation chamber;

d) providing a treatment chamber, which is isolated from said generation chamber by a gas impermeable light permeable member disposed along said optical path and which contains said substrate having a surface with matter thereon, wherein said substrate is disposed along said optical path;

e) withdrawing said ozone in a first stream from said generation chamber;

f) mixing a second stream containing deionized water vapor with said first stream to form a gaseous mixture;

g) delivering said gaseous mixture to said treatment chamber containing said substrate to oxidize said matter on said surface; and h) directing said optical source onto said surface to physically perform at least one of a cleaning or planarizing operation upon said substrate, including removing said oxidized matter.

23. An apparatus for treating a substrate, comprising:

a generation chamber containing an atmosphere including oxygen;

an optical source having an optical path extending though said generation chamber;

means for focusing said optical source along said optical path, including within said generation chamber to generate ozone from said oxygen;

a treatment chamber which contains said substrate and is isolated from said generation chamber by a gas impermeable light permeable member disposed along said optical path, said substrate being further disposed along said optical path, whereby said optical source can be focused within said cleaning chamber adjacent said substrate to clean or planarize a surface of said substrate; and means for withdrawing a first stream containing said ozone from said generation chamber and for delivering at least said first stream into said treatment chamber.

24. The apparatus as in claim 23, wherein said optical source and said focusing means are contained within said generation chamber.

25. The apparatus as in claim 23, further comprising:

a gas source for supplying a flow of gas containing oxygen to said generation chamber;

a sensing device for sensing the concentration of ozone and oxygen in said generation chamber; and an atmospheric control unit, responsive to said sensing device, which regulates said flow of gas from said gas source to said generation chamber to regulate ozone production in said generation chamber.

26. The apparatus as in claim 23, further comprising a substrate holder for holding said substrate.

27. The apparatus as in claim 26, wherein said substrate holder includes a chilling element.

28. The apparatus as in claim 26, wherein said substrate holder includes a heating element.

29. The apparatus as in claim 23, wherein said light permeable member comprises a quartz plate.

30. The apparatus as in claim 23, further comprising focus control means for controlling said focusing means to alternately focus said optical source within said generation chamber and within said treatment chamber.

31. The apparatus as in claim 23, further comprising:
  a second optical source having a second optical path along which said substrate is disposed; and
  second means for focusing said second optical source within said treatment chamber adjacent said substrate to treat the surface of said substrate.

32. The apparatus as in claim 23, wherein said generation chamber and said first stream further contain at least one constituent and said means for withdrawing and delivering comprise a conduit extending between said generation chamber and said treatment chamber for conveying said first stream from said generation chamber to said treatment chamber.

33. The apparatus as in claim 23, wherein said means for withdrawing and delivering comprise:
  a first conduit extending from said generation chamber to a junction for conveying said first stream to said junction;
  a second conduit extending from a source of at least one constituent to said junction for conveying a second stream from said source to said junction, wherein said first stream and said second stream form a mixture at said junction;
  a third conduit extending between said junction and said treatment chamber for conveying said mixture to said treatment chamber.

34. The apparatus as in claim 23, wherein said means for withdrawing and delivering comprise:
  a first conduit extending from said generation chamber to said treatment chamber for conveying said first stream to said treatment chamber; and
  a second conduit extending from a source of at least one constituent to said treatment chamber for conveying a second stream from said source to said treatment chamber, wherein said first stream and said second stream intermix within said treatment chamber.

35. The apparatus as in claim 23, wherein said means for withdrawing and delivering comprise a conduit extending into said treatment chamber to a position adjacent said surface of said substrate.

36. The apparatus of claim 23, further comprising:
  means for sensing a plurality of conditions in said treatment chamber; and
  means for regulating, in response to said plurality of conditions, the delivery of said ozone and said at least one constituent to said treatment chamber.

37. The apparatus as in claim 23, wherein said optical source comprises an Excimer laser.

38. The apparatus as in claim 23, wherein said means for focusing said optical source comprises a keplerian telescope.

39. The method of claim 1 in which step g) further comprises moving said surface relative to said optical source.

40. The apparatus as in claim 26, further comprising means for providing relative motion between said substrate holder and said optical source.

* * * * *